(12) United States Patent
Chatterjee et al.

(10) Patent No.: US 7,993,971 B2
(45) Date of Patent: Aug. 9, 2011

(54) FORMING A 3-D SEMICONDUCTOR DIE STRUCTURE WITH AN INTERMETALLIC FORMATION

(75) Inventors: Ritwik Chatterjee, Austin, TX (US); Eddic Acosta, Martindale, TX (US); Varughese Mathew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 267 days.

(21) Appl. No.: 11/966,126

(22) Filed: Dec. 28, 2007

(65) Prior Publication Data

US 2009/0170246 A1 Jul. 2, 2009

(51) Int. Cl.
*H01L 21/00* (2006.01)

(52) U.S. Cl. .................... 438/109; 257/778; 257/780

(58) Field of Classification Search .................... None
See application file for complete search history.

(56) References Cited

U.S. PATENT DOCUMENTS

| | | | |
|---|---|---|---|
| 4,950,623 A | 8/1990 | Dishon | |
| 5,234,149 A | 8/1993 | Katz et al. | |
| 5,660,321 A | 8/1997 | Ishida et al. | |
| 6,222,279 B1 | 4/2001 | Mis et al. | |
| 6,352,192 B1 * | 3/2002 | Lee et al. | 228/102 |
| 6,375,062 B1 * | 4/2002 | Higdon et al. | 228/214 |
| 2002/0020551 A1 * | 2/2002 | Rinne et al. | 174/261 |
| 2004/0072416 A1 * | 4/2004 | Fay | 438/614 |
| 2004/0206801 A1 * | 10/2004 | Mis et al. | 228/180.5 |
| 2006/0030139 A1 * | 2/2006 | Mis et al. | 438/612 |
| 2006/0278954 A1 * | 12/2006 | Izumi | 257/532 |
| 2007/0111384 A1 * | 5/2007 | Kinoshita et al. | 438/106 |

* cited by examiner

*Primary Examiner* — David Vu
*Assistant Examiner* — Shantanu C Pathak

(57) ABSTRACT

A method for forming a semiconductor structure includes forming a first contact pad on a first die, wherein the first contact pad comprises a first metal element, forming a metal over the first contact pad, wherein the metal comprises a second metal element, and the second metal element is different from the first metal element. The method further includes rapidly reflowing a portion of the metal to form a thin intermetallic layer. The method further includes attaching the first contact pad of the first die to a second contact pad of a second die, wherein attaching comprises heating the first contact pad and the second contact pad to reflow the metal to form an intermetallic layer such that substantially all of the metal formed over the first contact pad is used as part of the intermetallic layer.

12 Claims, 4 Drawing Sheets

FORMING A 3-D SEMICONDUCTOR DIE STRUCTURE WITH AN INTERMETALLIC FORMATION

BACKGROUND

1. Field

This disclosure relates generally to processes for forming semiconductor devices, and more specifically, to processes for forming a 3-D semiconductor die structure with an intermetallic formation.

2. Related Art

Traditional methods for forming a 3-D semiconductor die structure include metal-to-metal bonding of two wafers or dice. As part of this process, typically copper-tin metallurgy is used to form bonding pads. Thus, for example, a top die may have a bonding pad with copper and tin. The bottom die may have a copper bonding pad. The bottom die may also have a layer of no-flow underfill or a temporary adhesive. The top die is then typically aligned and placed on top of the bottom die and the two are subjected to thermo-compression bonding. The tin in the bonding pad of the top die, which may be formed using electroplating or immersion plating, is very rough. This results in the trapping of the no-flow underfill or the temporary adhesive material between bonding pads. The trapped no-flow underfill or the temporary adhesive material can cause reliability problems with the bond between the top die and the bottom die.

Accordingly, there is a need for processes for forming a 3-D semiconductor die structure with an intermetallic formation.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a method for forming a semiconductor structure is provided. The method includes forming a first contact pad on a first die, wherein the first contact pad comprises a first metal element, forming a metal over the first contact pad, wherein the metal comprises a second metal element, and the second metal element is different from the first metal element. The method further includes rapidly reflowing a portion of the metal to form a thin intermetallic layer, wherein the thin intermetallic layer is formed as a result of an interaction between the first metal element and the second metal element. The method further includes attaching the first contact pad of the first die to a second contact pad of a second die, wherein attaching comprises heating the first contact pad and the second contact pad to reflow the metal to form an intermetallic layer such that substantially all of the metal formed over the first contact pad is used as part of the intermetallic layer, wherein the intermetallic layer is formed as a result of an interaction between the first metal element, the second metal element, and at least a portion of the thin intermetallic layer.

In another aspect, a method for forming a semiconductor structure is provided. The method includes forming a first contact pad on a first die, wherein the first contact pad comprises a first metal element and sidewalls. The method further includes forming a metal over the first contact pad, wherein the metal comprises a second metal element, and the second metal element is different from the first metal element. The method further includes forming an oxide of the first metal element on the sidewalls of the first contact pad. The method further includes reflowing the metal for a first time period. The method further includes attaching the first contact pad of the first die to a second contact pad of a second die, wherein attaching comprises heating the first contact pad and the second contact pad for a second time period, wherein the second time period is longer than the first time period.

In yet another aspect, a method for forming a semiconductor structure is provided. The method includes forming a first contact pad on a first die, wherein the first contact pad comprises a first metal element and sidewalls. The method further includes forming a metal over the first contact pad, wherein the metal comprises a second metal element and the second metal element is different from the first metal element. The method further includes forming an oxide of the first metal element on the sidewalls of the first contact pad. The method further includes forming an intermetallic between the first contact pad and the metal, wherein the intermetallic comprises the first metal element and the second metal element. The method further includes attaching the first contact pad of the first die to a second contact pad of a second die.

Figure 1:
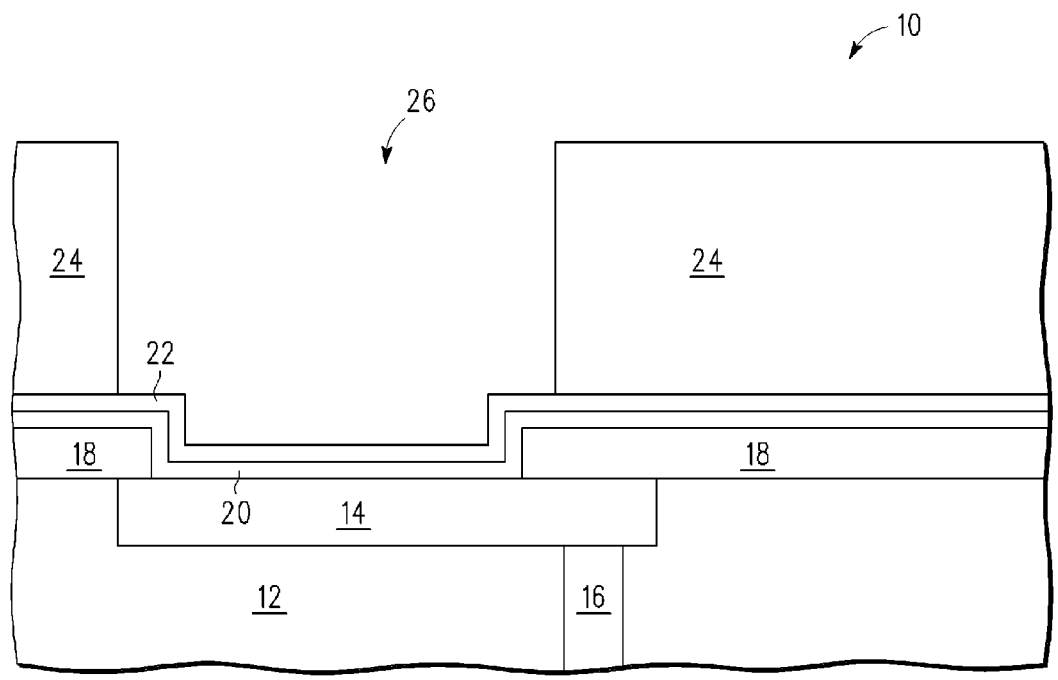
FIG. 1 is a view of a portion of a first die assembly during a processing stage.

FIG. 1 is a view of a portion of a first die assembly 10 during a processing stage. By way of example, the portion of first die assembly 10 may include a semiconductor die 12, which may include active devices and interconnects (not shown). Semiconductor die 12 may be formed over a semiconductor substrate. The semiconductor substrate described herein can be any semiconductor material or combinations of materials, such as gallium arsenide, silicon germanium, silicon-on-insulator (SOI), silicon, monocrystalline silicon, the like, and combinations of the above. A contact pad 14 may be coupled through a via 16 to any of the active devices or interconnects formed as part of semiconductor die 12. Contact pad 14 acts as an external contact for first die assembly 10 and is used to connect first die assembly 10 to another die assembly or wafer. Although FIG. 1 shows only one contact pad and only one via, first die assembly 10 may include additional contact pads and additional vias. Contact pad 14 can include any metal, such as copper. First die assembly 10 is also shown with a passivation layer 18 that does not cover a portion of contact pad 14. Passivation layer 18 may be formed using SiOx, SiN, SiON, an organic film, or any combination thereof.

Referring still to FIG. 1, a barrier layer 20 may be formed overlying a top surface of passivation layer 18 and the exposed portion of contact pad 14. By way of example, barrier layer 20 may include TiW, TiN, W, or other suitable materials, or combinations thereof. In one embodiment, barrier layer 20 may have a thickness in a range of 0.1 to 1.0 µm. Barrier layer 20 may be formed using a physical vapor deposition (PVD), chemical vapor deposition (CVD), or any other suitable process. Next, a seed layer 22 may be formed overlying a top surface of barrier layer 20. Seed layer 22 may comprise copper or any other suitable metal. In one embodiment, seed layer 22 may have a thickness in a range of 0.2 to 2.0 µm. Seed layer 22 may be formed using any suitable technique, such as physical vapor deposition (PVD), chemical vapor deposition (CVD), or any other suitable process.

With continued reference to FIG. 1, a patterned photoresist 24 may be formed overlying a top surface of seed layer 22. Patterned photoresist 24 includes an opening 26 located above the exposed portion of contact pad 14. Patterned photoresist 24 may comprise any suitable photoresist material formed by lithographic techniques. In one embodiment, patterned photoresist layer 24 may have thickness in a range of 13 to 25 µm or it may have thickness on the order of at least one micron thicker than a plated contact to be formed. Although FIG. 1 shows a specific type and a specific number of layers, first die assembly 10 may include additional or fewer layers.

Figure 2:
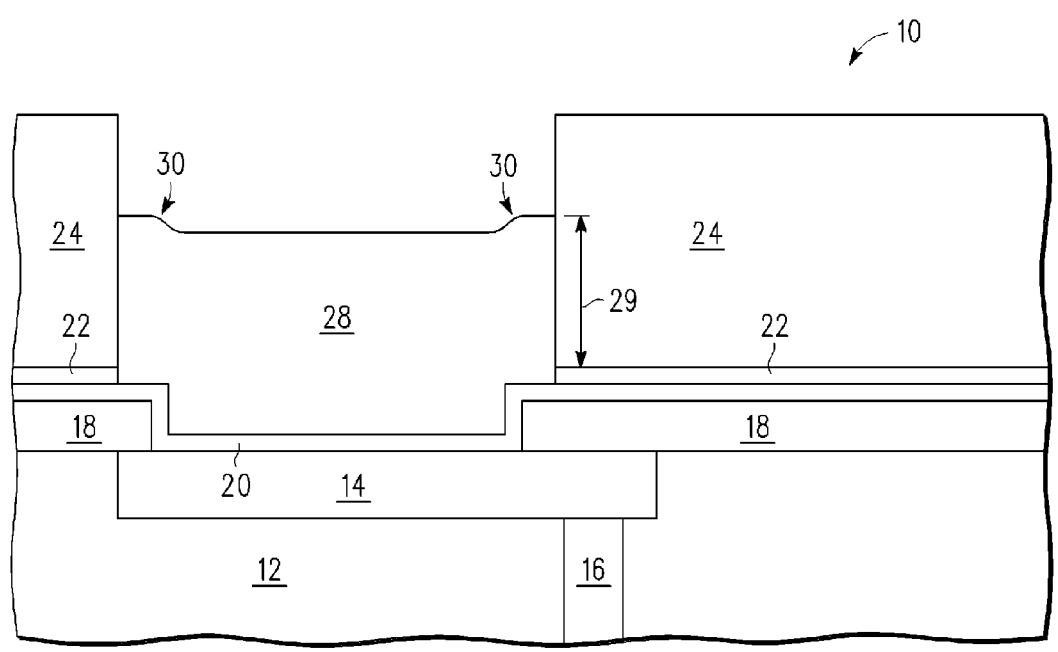
FIG. 2 is a view of the portion of the first die assembly of FIG. 1 with a plated contact pad during a processing step.

FIG. 2 is a view of the portion of the first die assembly of FIG. 1 with a plated contact pad during a processing step. By way of example, using suitable plating techniques, such as electroplating or electroless plating into opening 26 to form plated contact pad 28 having elevated corner portions 30. Elevated corner portions 30 may be formed as a result of plating over corner edges of seed layer 22, barrier layer 20, and passivation layer 18 overlying contact pad 14. In one embodiment, seed layer 22 may become part of plated contact pad 28, such that it is no longer distinguishable from plated contact pad 28. Plated contact pad 28 may be a micropad, which may have a much smaller height than the height of a flip-chip contact. Plated contact pad 28 may be formed using any suitable metal for die assembly, for example, copper. In one embodiment, plated contact 28 may have width in a range of 15 to 54 µm. In addition, plated contact 28 may have a height, such that the plated contact extends above seed layer 22 by an amount illustrated by reference numeral 29 (of the order of 5.0 µm). Also, the thickness of plated contact pad 28 may be selected such that it is sufficient to consume an overlying metal to be formed later on top of plated contact pad 28.

Figure 3:
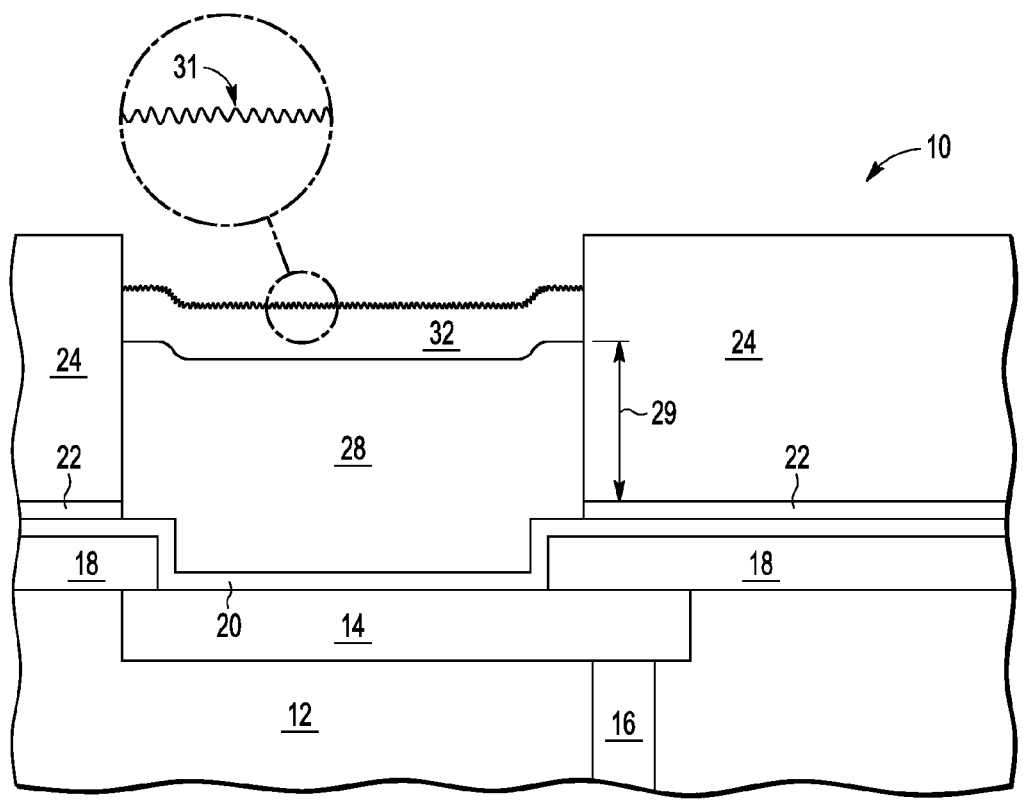
FIG. 3 is a view of the portion of the first die assembly of FIG. 2 with a plated contact pad and a metal layer during a processing step.

FIG. 3 is a view of the portion of the first die assembly of FIG. 2 with a plated contact pad and a metal layer during a processing step. Metal layer 32 may be deposited using suitable techniques overlying top surfaces of plated contact pad 28. In one embodiment, metal layer 32 may comprise tin (Sn). Alternatively, other metals, such as indium, gold, silver, silver-copper alloys, lead-tin, solder material, other suitable metals or alloys, or combinations thereof may be used based on the requirements of a die assembly. Metal layer 32 may be deposited using electrolytic plating or immersion plating. As shown in an expanded view in FIG. 3, the top surface 31 of metal layer 32 may be very rough. The rough surface may have crests and valleys in which a no-flow underfill material or a temporary adhesive material, which may be used to bond first die assembly 10 with another die assembly, may get trapped.

Figure 4:
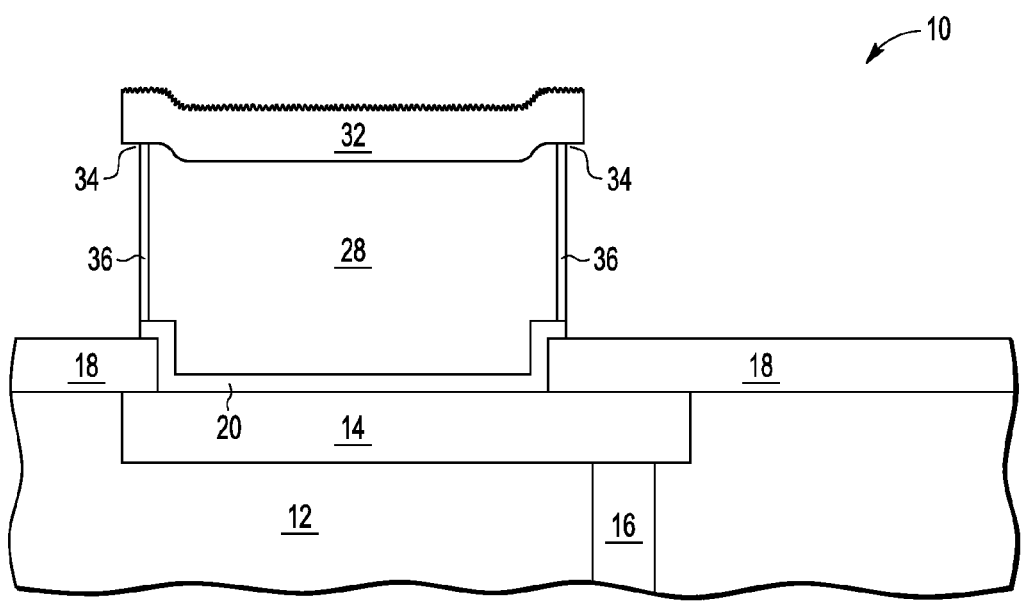
FIG. 4 is a view of the portion of the first die assembly of FIG. 3 with an oxide layer formed along a surface of the plated contact pad during a processing step.

FIG. 4 is a view of the portion of the first die assembly of FIG. 3 with an oxide layer formed along sidewalls of the plated contact pad during a processing step. By way of example, sidewalls of plated contact pad 28 may be oxidized forming a thin copper-oxide layer 36. In one embodiment, copper-oxide layer 36 may be formed because of a chemistry used to remove barrier layer 20. For example, if hydrogen peroxide is used to remove barrier layer 20, then it will also oxidize the sidewalls of plated contact pad 28. In instances, where a different process is used to remove barrier layer 20, such that no oxidation of the sidewalls of plated contact pad 28 occurs during the removal of barrier layer 20, then the sidewalls of plated contact pad 28 may be oxidized using another processing step. By way of example, the sidewalls of plated contact pad 28 may be oxidized by using oxygen in a plasma environment. Other suitable techniques may also be used to oxidize the sidewalls of plated contact pad 28 to form copper-oxide layer 36. After removal of patterned photoresist 24, the exposed portions of seed layer 22 and barrier layer 20 may be removed using a suitable etch process. As shown in FIG. 4, the removal of seed layer 22 may result some undercutting of plated contact pad 28 resulting in overhang features 34.

Figure 5:
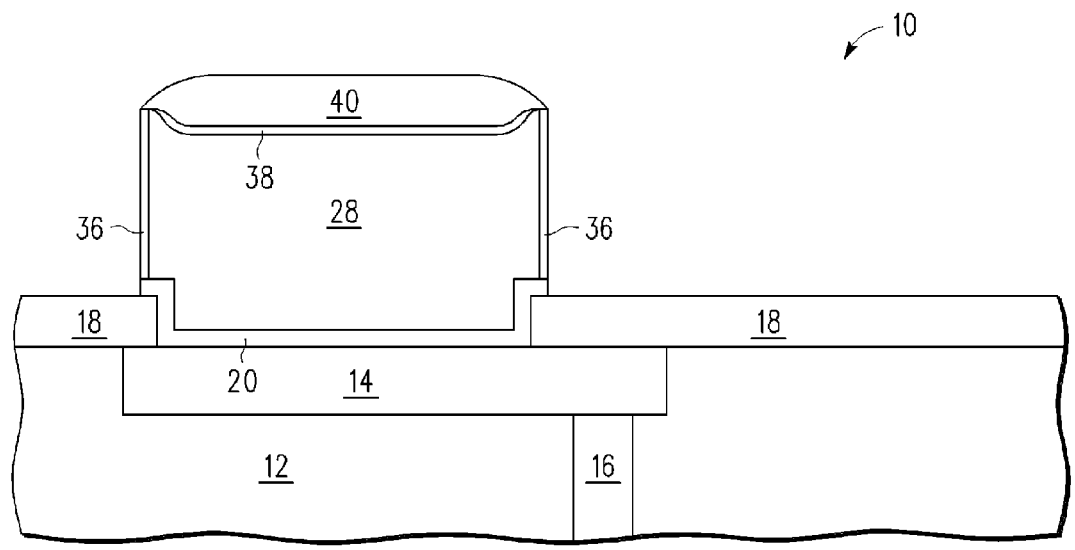
FIG. 5 is a view of the portion of the first die assembly of FIG. 4 during a processing step.

FIG. 5 is a view of the portion of the first die assembly of FIG. 4 during a processing step. By way of example, first die assembly 10 may be subjected to a processing involving a first set of conditions. In one embodiment, the process may be a rapid thermal anneal sufficient to rapidly reflow metal layer 32 into reflowed metal layer 40. The rapid thermal anneal may result in a thin intermetallic layer 38 formed at the junction of plated contact pad 28 and metal layer 32. In one embodiment, the conditions associated with the rapid thermal anneal may be controlled in a manner that intermetallic layer 38 that is formed during this step is very thin. By way of example, thin intermetallic layer 38 may be 1 µm thick. The rapid thermal anneal may be performed at a temperature in a range of 230 degrees Centigrade to 400 degrees Centigrade for a time period in a range of 5 seconds to 60 seconds. In one embodiment, rapid thermal anneal may be performed for 15 seconds. In one embodiment, the conditions associated with the rapid thermal anneal may be controlled such that a smooth rounded shape is created at the top surface, instead of the rough surface shown in FIGS. 3 and 4. In another embodiment, the conditions associated with the rapid thermal anneal may be controlled such that both a smooth rounded shape is created at the top surface and a very thin intermetallic layer 38 is formed, as well.

Figure 6:
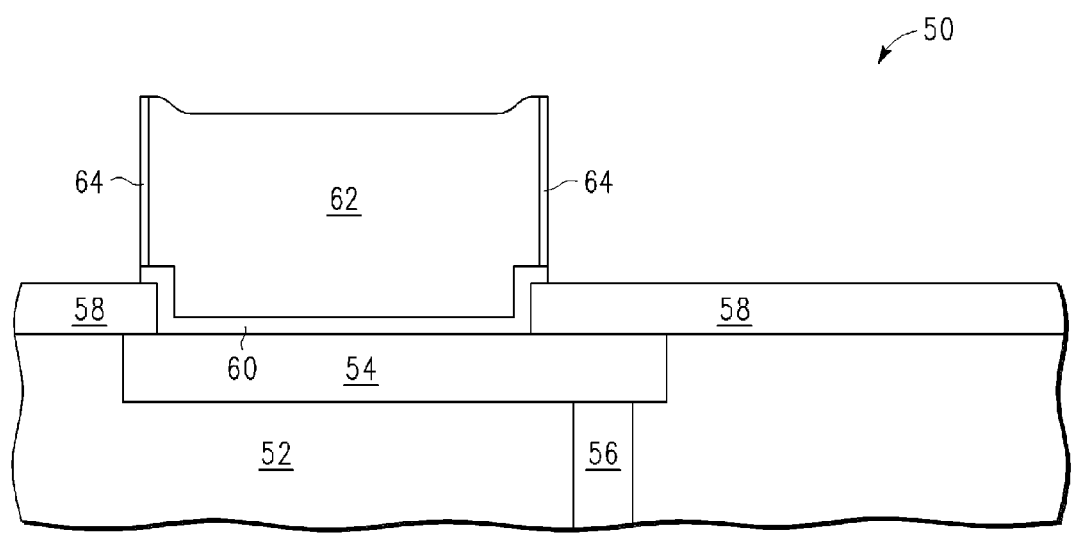
FIG. 6 is a view of a portion of a second die assembly with plated contact pad during a processing step.

FIG. 6 is a view of a portion of a second die assembly 50 with a plated contact pad during a processing step. Second die assembly 50 may include features similar to the ones present in first die assembly 10. In one embodiment, first die assembly 10 may comprise singulated dies and second die assembly 50 may be a wafer. Second die assembly 50 may be formed using similar processes and steps as used to form first die assembly 10, as described above with respect to FIGS. 1-4, except that second die assembly 50 may not have metal layer 32. By way of example, second die assembly 50 may include a semiconductor die 52, which may include active devices and interconnects (not shown). Semiconductor die 52 may be formed over a semiconductor substrate. The semiconductor substrate described herein can be any semiconductor material or combinations of materials, such as gallium arsenide, silicon germanium, silicon-on-insulator (SOI), silicon, monocrystalline silicon, the like, and combinations of the above. A contact pad 54 may be coupled through a via 56 to any of the active devices or interconnects formed as part of semiconductor die 52. Contact pad 54 acts as an external contact for second die assembly 50 and is used to connect second die assembly 50 to another die assembly or wafer. Although FIG. 6 shows only one contact pad and only one via, second die assembly 50 may include additional contact pads and additional vias. Contact pad 54 can include any metal, such as copper.

Still referring to FIG. 6, second die assembly 50 is also shown with a passivation layer 58 that does not cover a portion of contact pad 54. Second die assembly 50 may also include a barrier layer 60 formed over the exposed portion of contact pad 54 and part of a top surface of passivation layer 58. Moreover, a plated contact pad 62 may be formed in a manner similar to plated contact pad 28, as explained above with respect to the processing of first die assembly 10. In one embodiment, plated contact pad 62 may have similar dimensions as plated contact pad 28. Furthermore, as described above with respect to FIG. 4, a thin copper-oxide layer 64 may be formed on sidewalls of plated contact pad 62. Copper-oxide layer may be formed using similar processes, as described above with respect to FIG. 4.

Figure 7:
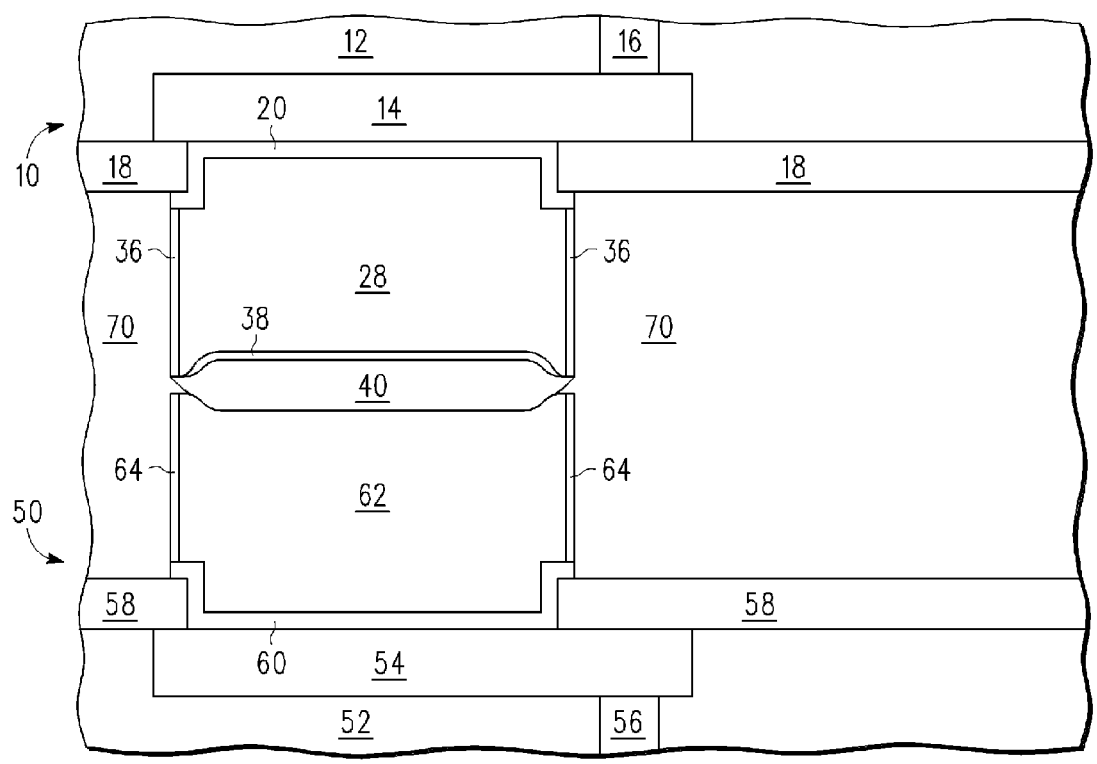
FIG. 7 is a view of placement of the portion of the first die assembly with respect to the portion of the second die assembly during a processing step.

FIG. 7 is a view of placement of the portion of the first die assembly 10 with respect to the portion of the second die assembly 50 during a processing step. Prior to the placement of first die assembly 10 with respect to second die assembly 50, a suitable material 70 is dispensed over a top surface of second die assembly 50. Upon placement of first die assembly 10 over second die assembly, material 70 is distributed between the two assemblies because of the effect of compressive force applied on material 70. By way of example, material 70 may be a suitable wax material, an organic adhesive, air, or any other suitable material for use in the placement step. First die assembly 10 is placed over second die assembly 50 in such a manner that plated contact pad 28 is substantially aligned with plated contact pad 62. Although FIG. 7 describes the placement of first die assembly 10 over second die assembly 50, second die assembly 50 may instead be placed over first die assembly. In addition, material 70 may be dispensed between the two die assemblies prior to the placement, during the placement, or after the placement step. Any suitable pick and place equipment may be used to perform this step.

Figure 8:
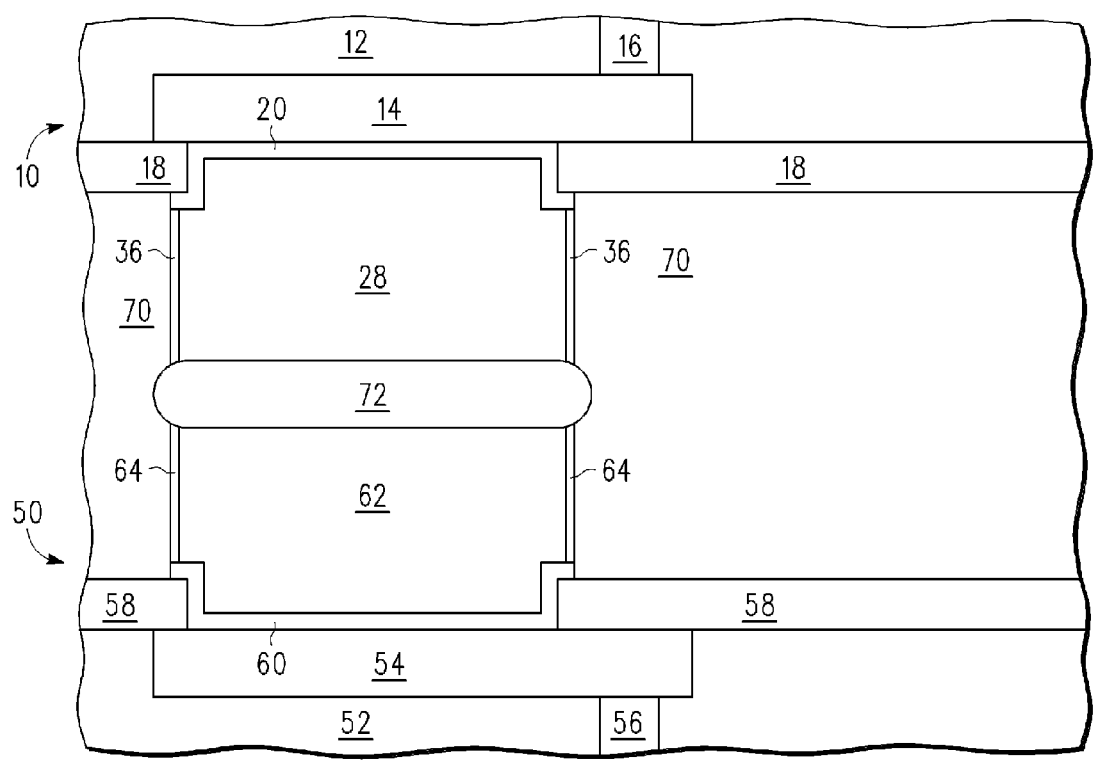
FIG. 8 is a view of thermal compression bonding of the portion of the first die assembly with the portion of the second die assembly during a processing step.

FIG. 8 is a view of thermal compression bonding of the portion of the first die assembly 10 with the portion of the second die assembly 50 during a processing step. Subsequent to the placement of first die assembly 10 over second die assembly 50, the two dies may be subjected to a process involving a second set of conditions. In one embodiment, the second process may be thermal compression bonding, using suitable equipment. By way of example, during this step enough pressure may be applied such that a desired level of bonding can occur between first die assembly 10 and second die assembly 50. In one embodiment, the bonding pressure may be in a range of 4.5 PSI to 27 PSI. In another embodiment, bonding force may be in a range of 1000 to 6000 Newtons for a 200 mm wafer. Other suitable levels of bonding pressure and bonding force may be used depending upon the size of the die assemblies, the type of die assemblies, and other requirements.

Referring still to FIG. 8, as part of the thermal compression bonding step, the die assemblies are also subjected to other processing conditions, including heating the die assemblies in a manner that plated contact pad 28 and plated contact pad 62 bond together forming intermetallics. In one embodiment, plated contact pad 28 and plated contact pad 62 may be heated locally without subjecting the entire die assemblies to all of the heat. In one embodiment, reflowed metal layer 40 may interact with plated contact pad 28, thin intermetallic layer 38, and plated contact pad 62 to form intermetallics 72. In one embodiment, reflowed metal layer 38 may comprise tin (Sn) and plated contact pads 28 and 62 may comprise copper (Cu) and intermetallics 72 may comprise $Cu_3Sn$, $Cu_6Sn_5$, or combinations thereof. In one embodiment, to form the intermetallics, reflowed metal layer 40 would have to be melted by applying a temperature greater than 232 degrees Centigrade for 30 minutes. Depending on the type of metals used as part of plated contact pad 28 and plated contact pad 62, other types of intermetallics may be formed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming semiconductor structure, comprising:
    forming a first contact pad on a first die, wherein the first contact pad comprises a first metal element;
    forming a metal over the first contact pad, wherein the metal comprises a second metal element, and the second metal element is different from the first metal element;
    forming a barrier layer on the first die, wherein a first portion of the barrier layer is under the first contact pad and a second portion of the barrier layer is adjacent the first contact pad;
    removing the second portion of the barrier layer;
    forming an oxide of the first metal element on sidewalls of the first contact pad after removing the second portion of the barrier layer;
    rapidly reflowing a portion of the metal to form a thin intermetallic layer, wherein the thin intermetallic layer is formed as a result of an interaction between the first metal element and the second metal element; and
    attaching the first contact pad of the first die to a second contact pad of a second die, wherein attaching comprises heating the first contact pad and the second contact pad to reflow the metal to form an intermetallic layer such that substantially all of the metal formed over the first contact pad is used as part of the intermetallic layer, wherein the intermetallic layer is formed as a result of an interaction between the first metal element, the second metal element, and at least a portion of the thin intermetallic layer.

2. The method of claim 1, wherein:
forming the oxide of the first metal element comprises using a first chemistry and occurs while removing the second portion of the barrier layer; and
removing the second portion of the barrier layer comprises using the first chemistry.

3. The method of claim 2, wherein the first chemistry comprises hydrogen peroxide.

4. The method of claim 1, wherein forming the oxide occurs using a plasma environment comprising oxygen.

5. The method of claim 1 further comprising rapidly reflowing the metal for a first time period and wherein attaching the first contact pad of the first die to the second contact pad of the second die comprises heating the first contact pad and the second contact pad for a second time period, and wherein the second time period is greater than the first time period.

6. The method of claim 5, wherein the first time period is approximately 15 to approximately 30 seconds and the second time period is approximately 30 minutes.

7. The method of claim 1, wherein forming the metal occurs at a first temperature and heating the first contact pad and second contact pad occurs at a second temperature, wherein the first temperature is greater than the second temperature.

8. The method of claim 1, wherein the first metal element comprises copper and the second metal element comprises an element selected from the group consisting of tin, indium, gold, silver, silver-copper alloy, lead-tin alloy, and solder material.

9. The method of claim 1, wherein the metal has a rough top surface and wherein rapidly reflowing the metal comprises reflowing the metal for a sufficient time such that the rough top surface is converted into a substantially smooth top surface.

10. The method of claim 1, wherein the thin intermetallic layer is less than approximately 1 micron thick.

11. The method of claim 1, wherein attaching the first contact pad of the first die to the second contact pad of the second die comprises applying a pressure to the first contact pad and the second contact pad.

12. A method of forming a semiconductor structure, comprising:
forming a first contact pad on a first die, wherein the first contact pad comprises a first metal element and sidewalls;
forming a metal over the first contact pad, wherein the metal comprises a second metal element and the second metal element is different from the first metal element;
forming an oxide of the first metal element on the sidewalls of the first contact pad;
forming an intermetallic between the first contact pad and the metal, wherein:
the intermetallic comprises the first metal element and the second metal element;
forming the intermetallic comprises reflowing the metal for a first time period; and
forming the intermetallic occurs after forming the oxide; and
attaching the first contact pad of the first die to a second contact pad on a second die, wherein attaching comprises heating the first contact pad and the second contact pad for a second time period, wherein the second time period is longer than the first time period.

* * * * *